United States Patent

Hutter et al.

[11] Patent Number: 6,025,231
[45] Date of Patent: Feb. 15, 2000

[54] SELF ALIGNED DMOS TRANSISTOR AND METHOD OF FABRICATION

[75] Inventors: Louis N. Hutter, Richardson; John P. Erdeljac; James R. Todd, both of Plano, all of Tex.

[73] Assignee: Texas Instruments Incorporated, Dallas, Tex.

[21] Appl. No.: 09/025,678

[22] Filed: Feb. 18, 1998

Related U.S. Application Data

[60] Provisional application No. 60/038,421, Feb. 18, 1997.

[51] Int. Cl.⁷ ................. H01L 21/336; H01L 21/8234
[52] U.S. Cl. .................. 438/268; 438/275; 438/286; 438/289
[58] Field of Search ........................ 438/268, 275, 438/286, 289, 294, 303, 305

[56] References Cited

U.S. PATENT DOCUMENTS

| | | | |
|---|---|---|---|
| 4,716,126 | 12/1987 | Cogan | 437/24 |
| 4,904,614 | 2/1990 | Fisher et al. | 437/41 |
| 5,283,202 | 2/1994 | Pike, Jr. et al. | 437/41 |
| 5,306,656 | 4/1994 | Williams et al. | 437/44 |
| 5,369,045 | 11/1994 | Ng et al. | 437/41 |
| 5,382,536 | 1/1995 | Malhi et al. | 437/41 |
| 5,548,147 | 8/1996 | Mei | 257/733 |
| 5,618,743 | 4/1997 | Williams et al. | 438/276 |
| 5,770,503 | 6/1998 | Hshieh et al. | 438/268 |
| 5,831,320 | 11/1998 | Kwon et al. | 438/288 |
| 5,854,099 | 12/1998 | Farrenkopf | 438/201 |
| 5,893,736 | 4/1999 | Lee et al. | 438/271 |
| 5,933,733 | 8/1999 | Ferla et al. | 438/268 |
| 5,933,734 | 8/1999 | Ferla et al. | 438/268 |

*Primary Examiner*—John F. Niebling
*Assistant Examiner*—Michael S. Lebentritt
*Attorney, Agent, or Firm*—Jacqueline J. Garner; Wade James Brady III; Richard L. Donaldson

[57] ABSTRACT

A method for fabricating a self-aligned DMOS transistor is provided. The method includes forming a passivation layer (18, 68) on an oxide layer (16, 66) of a substrate (12, 56). The oxide layer (16, 66) is then removed from the surface of the substrate (12, 56) where it is exposed through the passivation layer (18, 68). A reduced surface field region (36, 74) is then formed where the surface of the substrate (12, 56) is exposed through the passivation layer (18, 68). An oxide layer (38, 80) is then formed on the reduced surface field region (36, 74).

13 Claims, 4 Drawing Sheets

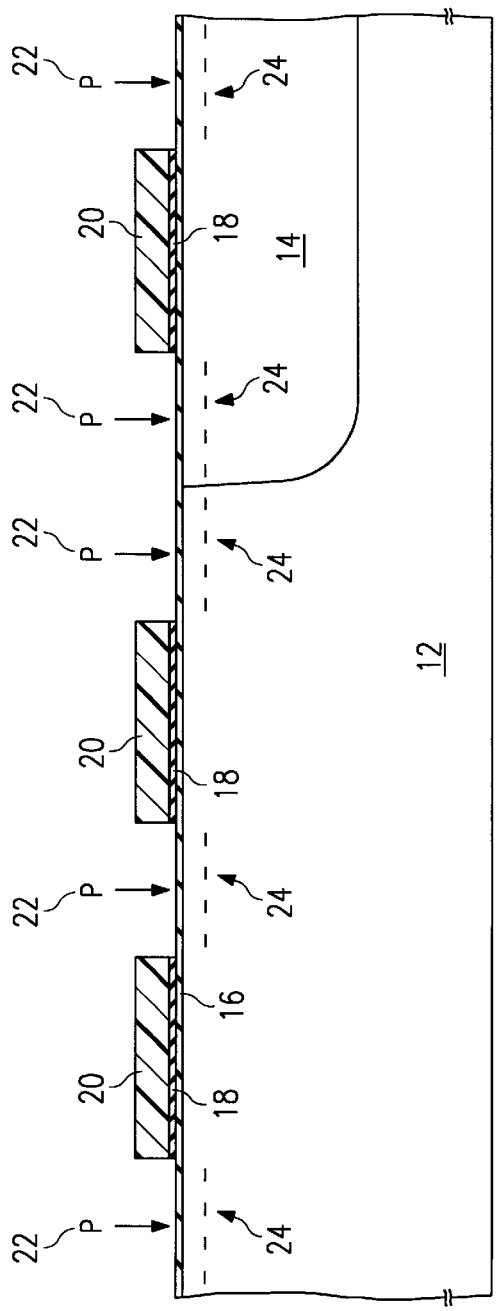
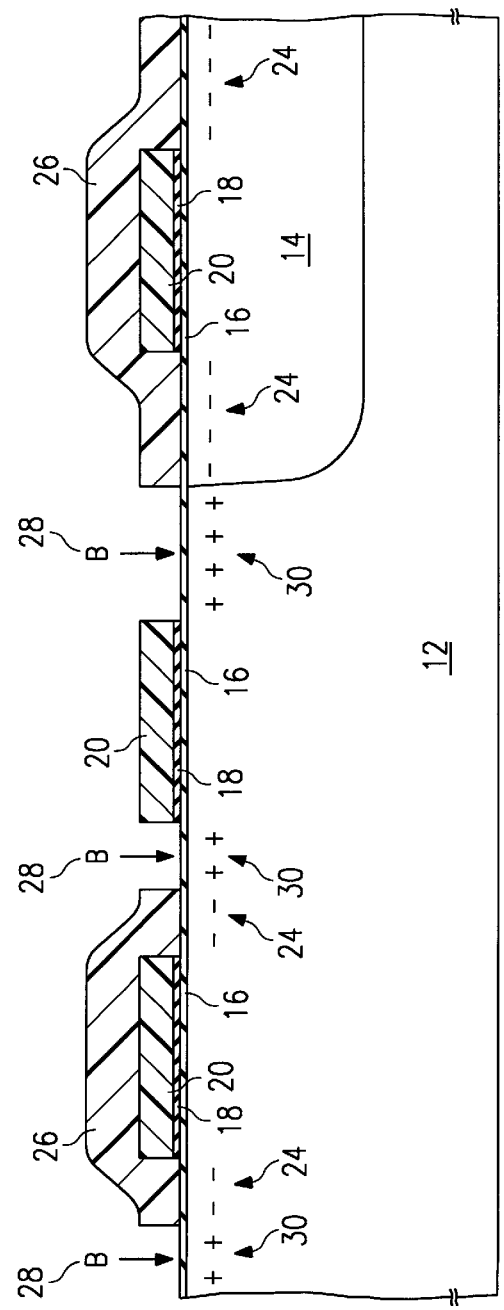

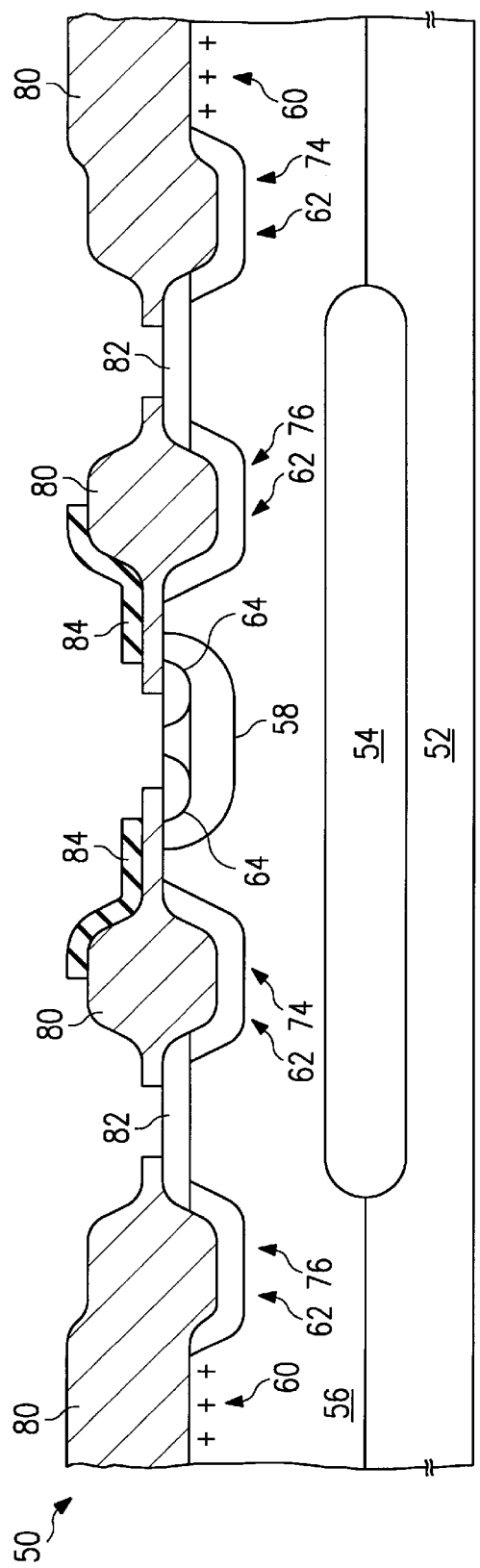
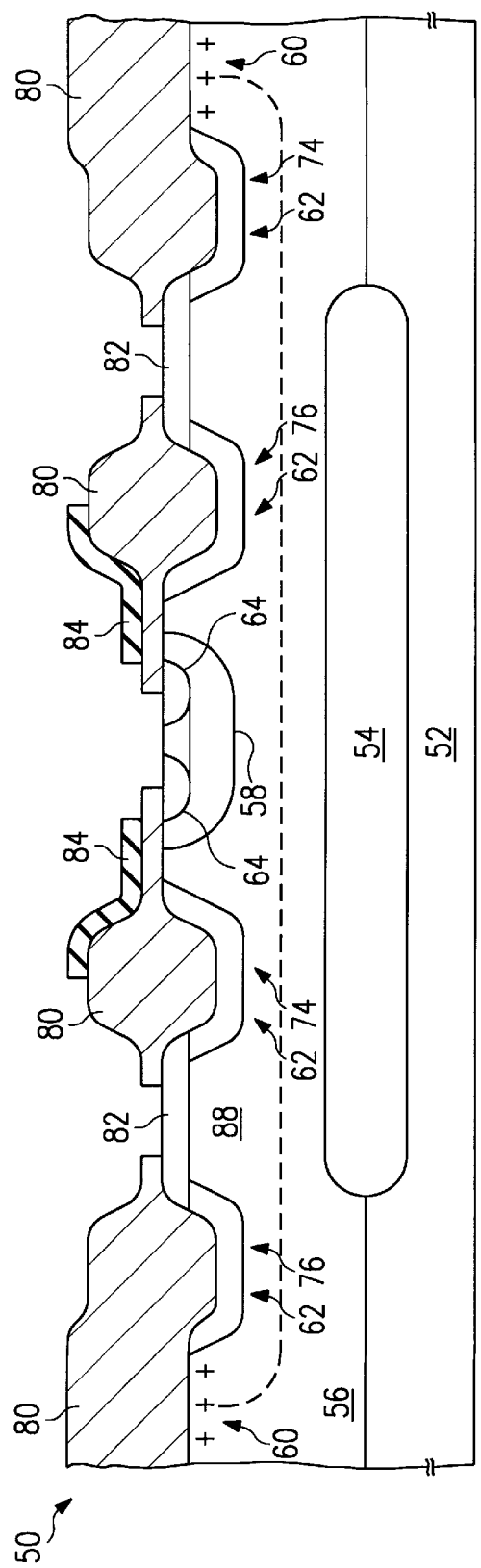
FIG. 7
FIG. 8

SELF ALIGNED DMOS TRANSISTOR AND METHOD OF FABRICATION

This application claims priority under 35 USC § 119(e)(1) of provisional application number 60/038,421 filed Feb. 18, 1997.

TECHNICAL FIELD OF THE INVENTION

This invention relates in general to methods for fabricating DMOS transistors, and more particularly to a self-aligned DMOS transistor and method of fabrication.

BACKGROUND OF THE INVENTION

Reduced surface field (resurf) double diffusion metal oxide substrate (DMOS) processes have been developed from conventional DMOS processes. In a DMOS device, an N-well is used to provide the drain of the device. In a reduced surface field DMOS device, the N-well is replaced by a shallow N-type region between the double diffusion well (D-well) and the drain contact diffusion.

Reduced surface field DMOS transistors offer the ability to achieve high OFF-state breakdown voltage (BVdss) as compared to conventional DMOS devices. As a result, these devices are very attractive for building cost effective intelligent power designs, as they are smaller than other devices used for power applications and they can therefore reduce the area needed for the power device.

The nature of reduced surface field DMOS devices requires careful alignment of masking levels. Normal process variations can cause misalignment or variations in alignment between the reduced surface field regions and the active regions, which can cause the OFF-state breakdown voltage to be lower than optimal. Known methods of fabricating reduced surface field regions in DMOS devices are not capable of controlling the alignment of the reduced surface field regions and the active regions to an acceptable level of accuracy.

SUMMARY OF THE INVENTION

Therefore a need has arisen for a reduced surface field DMOS transistor and method of fabrication that addresses shortcomings of the prior reduced surface field DMOS transistors and methods of fabrication.

In particular, a reduced surface field DMOS transistor with self-alignment between the reduced surface field regions and active regions is required.

One aspect of the present invention is a method for fabricating a self-aligned DMOS transistor. The method includes forming a passivation layer on an oxide layer of a substrate. The oxide layer is then removed from the surface of the substrate where it is exposed through the passivation layer. A reduced surface field region is then formed where the surface of the substrate is exposed through the passivation layer. An oxide layer is then formed on the reduced surface field region.

The present invention provides many technical advantages. One technical advantage of the present invention is a reduced surface field DMOS transistor with self-aligned reduced surface field regions and active regions. Another technical advantage of the present invention is a method of manufacturing a reduced surface field DMOS transistor with self-alignment between the reduced surface field regions and the active regions.

BRIEF DESCRIPTION OF THE DRAWINGS

For a more complete understanding of the present invention and advantages thereof, reference is now made to the following descriptions taken in conjunction with the accompanying drawings in which like reference numbers indicate like features and wherein:

FIG. 1 is a cross-sectional view of the phosphorus channel stop implant step for the DMOS transistor fabrication process;

FIG. 2 is a cross-sectional view of the boron channel stop implant step for the DMOS transistor fabrication process;

FIG. 7 is a cross-sectional view of a reduced surface field DMOS transistor after complementary metal-oxide semiconductor source and drain processing has been completed; and FIG. 8 is a cross-sectional view of a reduced surface field DMOS transistor with an N-well adjust implant.

DETAILED DESCRIPTION OF THE INVENTION

Figure 3:
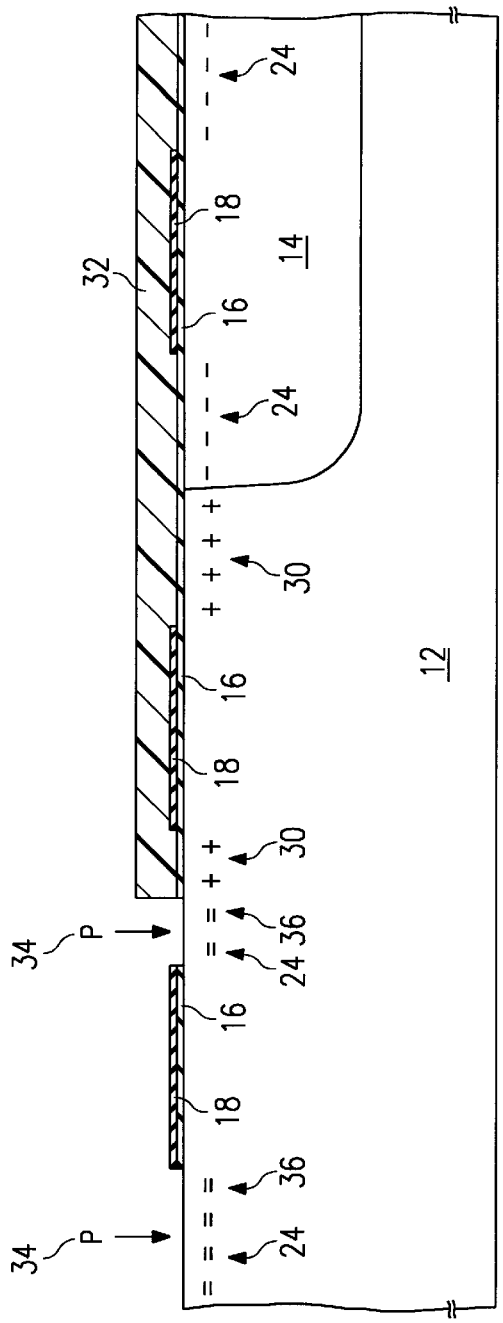
FIG. 3 is a cross-sectional view of the reduced surface field implant self-alignment process step for the DMOS transistor fabrication process.

Preferred embodiments of the present invention are illustrated in the FIGURES, like numerals being used to refer to like and corresponding parts of the various drawings.

Table 1 shows the major process steps in a known baseline process flow for manufacturing bipolar junction devices and complementary metal oxide substrate devices (BiCMOS), with additional steps for two processes that provide self-aligning of the reduced surface field region for a DMOS transistor. This baseline process flow outlines a known CMOS-driven BiCMOS process where the high-temperature bipolar junction device processing steps are performed prior to the CMOS implant steps. The present invention advantageously does not disturb or alter the baseline process flow.

TABLE 1

Standard BiCMOS Process Flow with RESURF DMOS Module

| | |
|---|---|
| 1 | Material Start |
| 2 | First Epitaxial Layer |
| 3 | Buried Layer (Mask) |
| 4 | Second Epitaxial Layer |
| 5 | Nwell (Mask) |
| 6 | N+ Collector Deposition (Mask) |
| 7 | N+ Collector Diffusion |
| 8 | DMOS Pattern (Mask) |
| 9 | D-Well Implant |
| 10 | N Source |
| 11 | D-Well Diffusion |
| 12 | Base (Mask) |
| 13 | Moat (Mask) |
| 14 | Phos Channel Stop Implant |
| 15 | Channel Stop (Mask) |
| 16 | Boron Channel Stop Implant |
| 17 | STANDARD ALIGNMENT - RESIST CLEANUP |
| 18 | STANDARD ALIGNMENT - RESURF PATTERN |
| 19 | STANDARD ALIGNMENT - RESURF OXIDE ETCH |
| 20 | STANDARD ALIGNMENT - RESURF IMPLANT |

TABLE 1-continued

Standard BiCMOS Process Flow with RESURF DMOS Module

| | |
|---|---|
| 21 | STANDARD ALIGNMENT - RESIST CLEANUP |
| 22 | Gate Oxide 1 |
| 23 | VT Adjust (Mask) |
| 24 | Poly-1 (Mask) |
| 25 | ILO/ILN (Capacitor Dielectric) |
| 26 | Poly-2 (Mask) |
| 27 | N-S/D (Mask) |
| 28 | Sidewall |
| 29 | N + S/D (Mask) |
| 30 | P + S/D (Mask) |
| 31 | Emitter (Mask) |
| 32 | MLO Deposition |
| 33 | Contact (Mask) |
| 34 | Silicide |
| 35 | Metal-1 (Mask) |
| 36 | Interlevel Oxide |
| 37 | Via (Mask) |
| 38 | Metal-2 (Mask) |
| 39 | PO (mask) |

The process for self-alignment of the reduced surface field DMOS regions is provided by steps 17 through 21. This process allows the field oxide to be formed in conjunction with the channel stop diffusion step. In practice, the alignment process will typically be used on a single substrate chip. As shown in Table 1, the addition of the alignment process does not result in any additional processing for the remaining steps to implement changes to non-DMOS devices. Thus, the present invention may advantageously be implemented in a known baseline process flow for manufacturing bipolar junction devices and complementary metal oxide substrate devices, which reduces development and testing costs.

FIG. 1 is a cross-sectional view of the phosphorus channel stop implant step for the reduced surface field DMOS transistor 10 fabrication process. Reduced surface field DMOS transistor 10 includes P− epitaxial layer 12 and N-well 14. P− epitaxial layer 12 is a doped silicon crystalline structure that may be formed on a silicon crystal wafer by vapor phase epitaxy, liquid phase epitaxy, or other suitable methods. In addition, P− epitaxial layer 12 may be other suitable materials, such as gallium arsenide or other semiconducting materials. N-well 14 is a doped region in P− epitaxial layer 12 that is formed by ion implantation and diffusion of a suitable material, such as phosphorus, arsenic, or antimony.

Pad oxide layer 16 covers the surface of P− epitaxial layer 12 and N-well 14. Pad oxide layer 16 is a layer of silicon oxide that is formed by surface oxidation of P− epitaxial layer 12 and N-well 14, but which may also be formed by other suitable methods. Silicon nitride layer 18 and photoresist layer 20 are formed on pad oxide layer 16 to define the inverse moat region of reduced surface field DMOS transistor 10.

For example, silicon nitride layer 10 may be deposited uniformly over pad oxide layer 16, and inverse moat photoresist layer 20 may then be formed by deposition of a photosensitive organic material that can be polymerized by ultraviolet light. This photosensitive material is then exposed to ultraviolet light through a mask, causing predetermined areas to be polymerized. The unpolymerized photosensitive material is then removed leaving photoresist layer 20, and silicon nitride 18 is then etched by a suitable material.

After the inverse moat pattern is formed from silicon nitride layer 18 and photoresist layer 20, a phosphorus implant 22 is performed to create inverse moat region 24. For example, phosphorus implant 22 may be performed at an energy level of 150 keV and with a dopant density of $1.1 \times 10^{12}$ atoms/cm$^2$, or at other suitable energies so as not to penetrate silicon nitride layer 18 and photoresist layer 20.

FIG. 2 is a cross-sectional view of the boron channel stop implant step for the reduced surface field DMOS transistor 10 fabrication process. Channel stop photoresist layer 26 has been formed over inverse moat photoresist layer 20 to define the channel stop regions. Boron implant 28 is then performed to form channel stop regions 30, as shown. For example, boron implant 28 may be performed at an energy level of 100 keV and a dopant density of $3.5 \times 10^{13}$ atoms/cm$^2$, or at other suitable energy levels and densities. Channel stop regions 30 overlap inverse moat regions 24, but are performed at a greater carrier concentration and thus predominate in those regions.

FIG. 3 is a cross-sectional view of the reduced surface field implant self-alignment process step for the DMOS transistor 10 fabrication process. Channel stop photoresist layer 26 and inverse moat photoresist layer 26 are removed, and reduced surface field resist layer 32 is formed. In addition, pad oxide layer 16 is removed in the reduced surface field regions. An n-type material such as phosphorus 34 is then performed to form reduced surface field regions 36. Phosphorus 34 is implanted at a suitable dopant concentration and at an energy level such as 60 keV, so as not to penetrate pad oxide layer 16 and silicon nitride layer 18. In this manner, reduced surface field regions 36 have been self-aligned to the moat regions.

Figure 4:
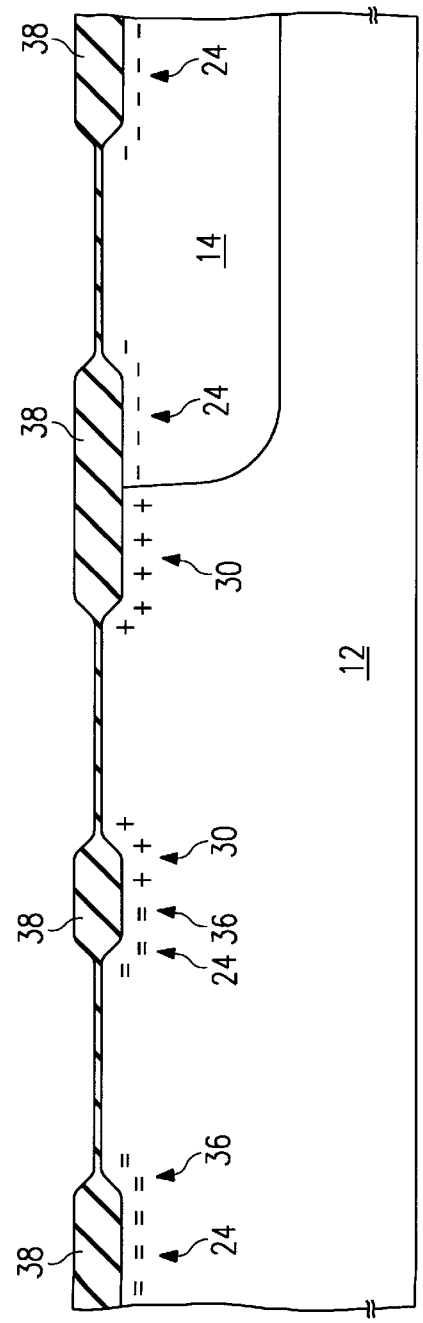
FIG. 4 is a cross-sectional view of the reduced surface field oxide growth step for the DMOS transistor fabrication process.

FIG. 4 is a cross-sectional view of the reduced surface field oxide growth step for the DMOS transistor 10 fabrication process. Field oxide layer 38 has been formed during the channel stop diffusion step, thus forming the self-aligned field oxide region. The reduced surface field region will out-diffuse slightly under the moat region during the heat cycling associated with this step.

Figure 5:
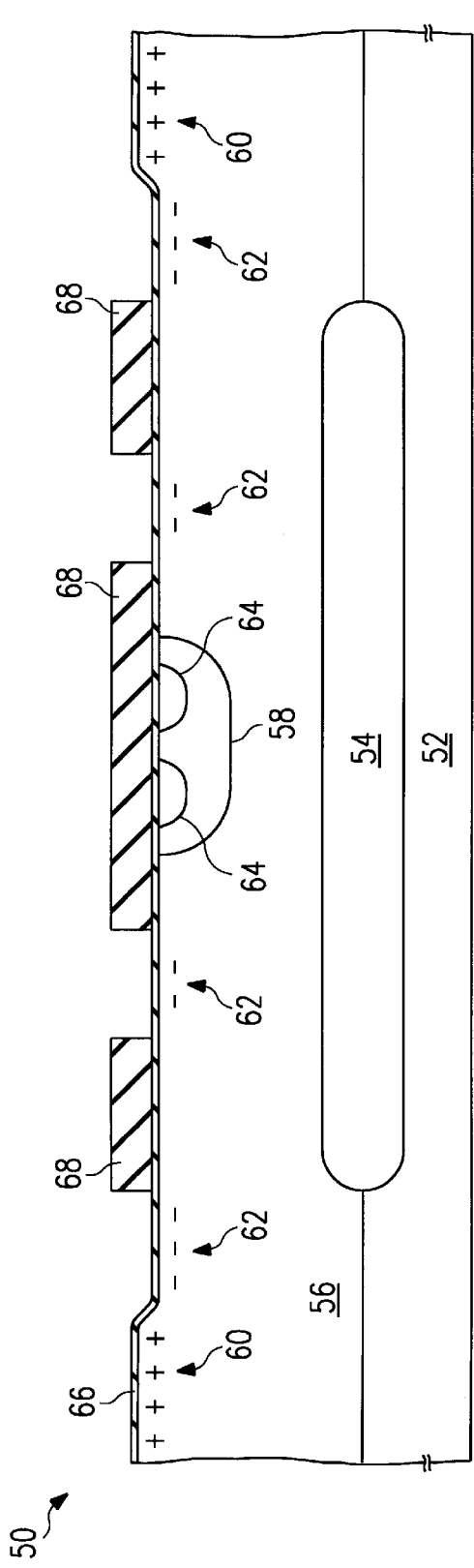
FIG. 5 is a cross-sectional view of a reduced surface field DMOS transistor after a standard channel stop module has been completed.

FIG. 5 is a cross-sectional view of a reduced surface field DMOS transistor 50 after a standard channel stop module has been completed. Reduced surface field DMOS transistor 50 includes P+ substrate 52, which is a silicon substrate crystal formed by suitable crystal growth methods, such as the Czochralski method and sliced to an appropriate thickness. N+ diffusion region 54 is implanted to improve the performance of reduced surface field DMOS transistor 50 as a high side driver (HSD). P− epitaxial layer 56 is then formed on P+ substrate 52 and N+ diffusion region 54 by vapor phase epitaxy, liquid phase epitaxy, or other suitable methods.

Reduced surface field DMOS transistor 50 also includes d-well region 58, boron channel stop regions 60, phosphorus channel stop regions 62, and source/backgate regions 64. Pad oxide layer 66 is grown over P−epitaxial layer 56 and D-well region 58. Silicon nitride layer 68 is a passivation layer that is etched to form a portion of the reduced surface field implant region mask.

Figure 6:
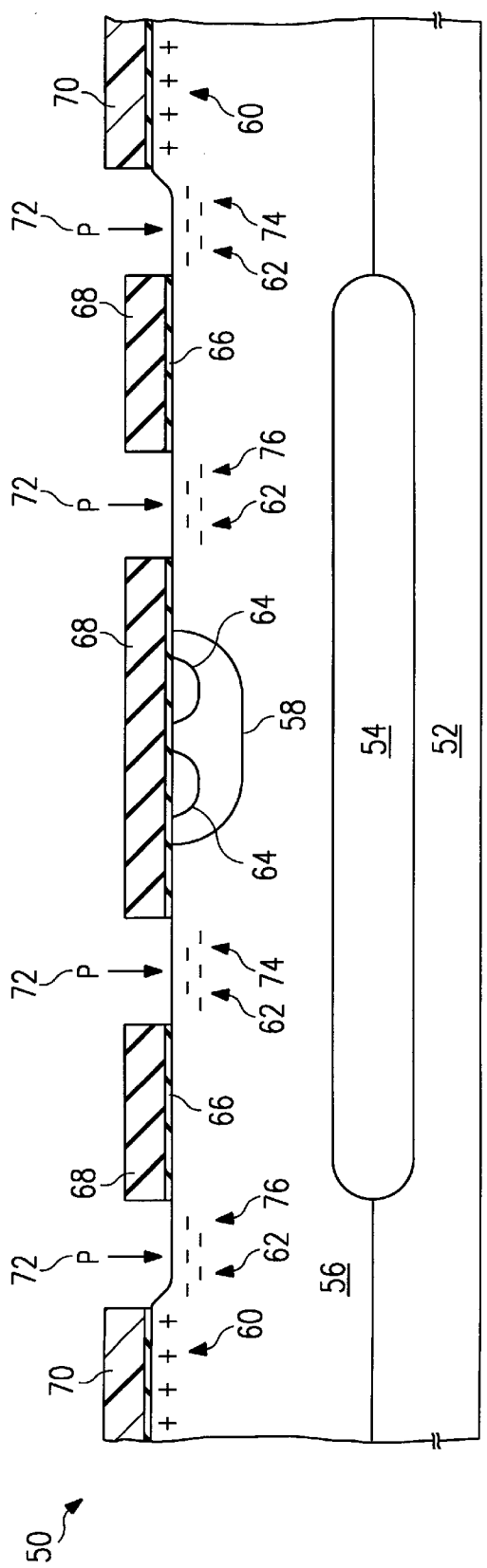
FIG. 6 is a cross-sectional view of a reduced surface field DMOS transistor after the reduced surface field pattern, etch, and implant steps have been completed.

FIG. 6 is a cross-sectional view of reduced surface field DMOS transistor 50 after the reduced surface field pattern, etch, and implant steps have been completed. Reduced surface field photoresist layer 70 is first formed to further define the reduced surface field regions. Pad oxide layer 66 is then removed to expose the surface of P− epitaxial layer 56. Phosphorus 72 is then implanted at an appropriate density and energy level, such as 60 keV, so as to only penetrate into the areas of P−epitaxial layer 56 where pad oxide layer 66 has been removed. Phosphorus 72 adds to the previous phosphorus channel stop region 62 and abuts boron channel stop regions 60.

FIG. 7 is a cross-sectional view of reduced surface field DMOS transistor 50 after complementary metal-oxide semiconductor source and drain processing has been completed. Reduced surface field DMOS transistor 50 includes field oxide regions 80, which surround drain regions 82 and source/backgate region 64. Polysilicon gate contacts 84 capacitively couple the device through field oxide 80. Drain regions 82 are used to contact the sides of the out-diffused reduced surface field regions 74 and phosphorus channel stop regions 62 to form the drain regions of reduced surface field transistor 50. D-well 58 and source/backgate region 64 are contacted through the P+ source and drain regions and the N+ source and drain regions, respectively.

FIG. 8 is a cross-sectional view of reduced surface field DMOS transistor 50 with an N-well adjust implant 88. N-well adjust implant 88 may be included to improve the reduced surface field effects of P-epitaxial layer 56. N-well adjust implant is used to raise the doping level of P-epitaxial layer 56 underneath the N-type reduced surface field region. This allows the reduced surface field region to be depleted faster during reverse bias, thus improving the breakdown voltage.

In operation, the self-aligned field oxide regions are formed by the alignment process described above. A transistors incorporating the self-aligned field oxide regions exhibits the superior OFF-state blocking voltage characteristic of reduced surface field transistors, as a result of the improved saturation behavior of the reduced surface field regions.

The present invention provides many technical advantages. One technical advantage of the present invention is a reduced surface field DMOS transistor with self-aligned reduced surface field regions and D-well regions. Another technical advantage of the present invention is a method of manufacturing a reduced surface field DMOS transistor with self-alignment between the reduced surface field regions and the D-well regions.

Although the present invention has been described in detail, it should be understood that various changes, substitutions, and alterations may be made hereto without departing from the spirit and the scope of the invention as defined by the appended claims. For example, the thicknesses of various layers of materials, where provided, are exemplary or representative of a best mode and are not required unless explicitly stated otherwise.

What is claimed is:

1. A method for fabricating a self-aligned DMOS transistor comprising the steps of:
    forming a passivation layer on an oxide layer of a substrate;
    removing the oxide layer from the surface of the substrate where it is exposed through the passivation layer;
    forming a reduced surface field region where the surface of the substrate is exposed through the passivation layer; and
    forming an oxide layer on the reduced surface field region.

2. The method of claim 1 further comprising the step of removing the passivation layer.

3. The method of claim 1 further comprising the step of forming a layer of polycrystalline silicon on the oxide layer and overlapping the reduced surface field region, a D-well region, and an N-source region.

4. The method of claim 1 wherein the forming a reduced surface field region step further comprises implanting a material having a first conductivity type with an energy of approximately 60 keV.

5. The method of claim 1 wherein the forming an oxide layer step further comprises the step of forming an oxide layer on the reduced surface field region during a channel stop diffusion process.

6. The method of claim 1 wherein the forming an oxide layer step further comprises the step of forming an oxide layer on the reduced surface field region by local oxidation of the substrate.

7. The method of claim 1 further comprising the step of forming an N-well adjust region in the substrate prior to the step of forming the passivation layer.

8. The method of claim 1 wherein the step of forming the passivation layer further comprises forming a nitride layer using a low pressure vapor chemical deposition process.

9. A method for fabricating a self-aligned reduced surface field DMOS transistor comprising the steps of:
    forming a nitride layer on an oxide layer of a substrate using low pressure chemical vapor deposition;
    removing the oxide layer from the surface of the substrate where it is exposed through the passivation layer;
    forming a reduced surface field region where the surface of the substrate is exposed through the passivation layer;
    forming an oxide layer on the reduced surface field region;
    removing the passivation layer; and
    forming a layer of polycrystalline silicon on the oxide layer and overlapping the reduced surface field region, a D-well region, and an N-source region.

10. The method of claim 9 wherein the forming a reduced surface field region step further comprises implanting a material having a first conductivity type with an energy of approximately 60 keV.

11. The method of claim 9 wherein the forming an oxide layer step further comprises the step of forming an oxide layer on the reduced surface field region during a channel stop diffusion process.

12. The method of claim 9 wherein the forming an oxide layer step further comprises the step of forming an oxide layer on the reduced surface field region by local oxidation of the substrate.

13. The method of claim 9 further comprising the step of forming an N-well adjust region in the substrate prior to the step of forming the passivation layer.

* * * * *